United States Patent
Sun et al.

(10) Patent No.: US 7,303,400 B2
(45) Date of Patent: *Dec. 4, 2007

(54) PACKAGE OF A SEMICONDUCTOR DEVICE WITH A FLEXIBLE WIRING SUBSTRATE AND METHOD FOR THE SAME

(75) Inventors: Joseph Sun, Hsin-Chu (TW); Kuang-Chih Cheng, Yun-Lin (TW); Ming-Chieh Chen, Hsin-Chu (TW); Kevin Lee, Hsin-Chu (TW); Jui-Hsiang Pan, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/050,814

(22) Filed: Jan. 27, 2005

(65) Prior Publication Data

US 2005/0161756 A1    Jul. 28, 2005

Related U.S. Application Data

(63) Continuation-in-part of application No. 10/764,469, filed on Jan. 27, 2004, now abandoned.

(51) Int. Cl.
*H01R 12/00* (2006.01)
(52) U.S. Cl. .......................... 439/64; 439/77; 257/734
(58) Field of Classification Search ............ 439/64–65, 439/71–77; 257/226, 414, 733, 737–738, 257/734
See application file for complete search history.

(56) References Cited

U.S. PATENT DOCUMENTS

| | | | |
|---|---|---|---|
| 6,737,292 B2 * | 5/2004 | Seo .............................. | 438/64 |
| 2004/0157359 A1 * | 8/2004 | Stecher ....................... | 438/106 |

* cited by examiner

*Primary Examiner*—Khiem Nguyen

(57) ABSTRACT

A package of a semiconductor device with a flexible wiring substrate and a method thereof are provided. The package of the semiconductor device includes a semiconductor substrate with at least one pad on a surface thereof, a bump bonded to the pad, an adhesive layer on the bump, and a flexible wiring substrate having at least one contact section being electrically connected with the bump by the adhesive layer. The present invention makes the flexible wiring substrate directly conductively attached onto the semiconductor substrate. The package size is shrunk and the cost down can be obtained.

12 Claims, 13 Drawing Sheets

PACKAGE OF A SEMICONDUCTOR DEVICE WITH A FLEXIBLE WIRING SUBSTRATE AND METHOD FOR THE SAME

CROSS-REFERENCE TO RELATED APPLICATIONS

This application is a Continuation In Part application of Ser. No. 10/764,469, filed Jan. 27, 2004, by inventor Joseph SUN et al. now abandoned entitled "PACKAGE OF A SEMICONDUCTOR DEVICE WITH A FLEXIBLE WIRING SUBSTRATE AND METHOD FOR THE SAME". The subject matter of this application is also related to the subject matter in application Ser. No. 10/764,469.

BACKGROUND OF THE INVENTION

1. Field of the Invention

The present invention relates to a package of semiconductor device, and more particularly to a package of semiconductor device electrically connected with a flexible printed circuit board.

2. Description of the Prior Art

Ever increasing industry demand for smaller and smaller electronic packages with a low profile, higher area density and increasing number of input/output connections (I/Os) has led to increasing demand for the chip scale package. Use of such packages may be found in small portable products, such as cellular phones, pagers, and the like. Moreover, a flexible printed circuit board (FPC) is widely used in view of the freedom of packaging form and the space saving. A wire bonding is frequently used when a high-density package is required or a package space is limited.

FIG. 1 is a schematic configuration of a known package of an image sensor device incorporated with a handset. The package of the image sensor device has a silicon substrate 101 having at least one pad 105 on a surface thereof and an image sensor device 102, such as CMOS (Complementary Metal-Oxide-Semiconductor) sensor, LCOS (Liquid Crystal-On-Silicon), on the surface. A glass plate 103 is placed above the surface of the silicon substrate 101 having the image sensor device 102. The glass plate 103 is used for preventing airborne dust or other particles from adhering unto the image sensor device 102, causing the image sensor device 102 damage. The glass plate 103 is attached unto the silicon substrate 101 by adhesive material 104. The silicon substrate 101 is placed on a printed circuit board 100, and the pad 105 is connected with an I/O terminal of the printed circuit board 100 via a metal wire 106 by wire bonding. A lens housing 107 enclosing the whole silicon substrate 101 is held on the printed circuit board 100. A lens set 108 is positioned above the glass plate 103 and held by the lens housing 107. A flexible printed circuit board 109 is attached onto the printed circuit board 100. In general, the fingers of the leads of the flexible printed circuit board 109 are bonded to a contact portion of the printed circuit board 100. The flexible printed circuit board 109 is electrically connected to a main board of the handset. The image sensor device 102 captures image signals, and transfers the image signals to electric signals. Then, the electric signals are transmitted to the flexible printed circuit board 109 via an interface, i.e., the printed circuit board 100, and then transmitted to the main board of the handset.

The package of the image sensor device of FIG. 1 is troublesome and bulky. However, the flexible printed circuit board 109 cannot be directly attached unto the silicon substrate 101 due to the configuration of the image sensor device. It is necessary to form a gold bump on the pad 105 of the silicon substrate 101 before the fingers of the leads of the flexible printed circuit board 109 are to be electrically connected with the pad 105. However, the gold bump cannot be electroplated on the pad 105 of the silicon substrate 101 because the glass plate 103 has been covered on the silicon substrate 101. When the silicon substrate 101 is uncovered with the glass plate 103, the image sensor device 102 is easily subjected to damage by the particles during the process of the package, and resulting in a low yield. Therefore, the flexible printed circuit board 109 cannot be directly attached unto the silicon substrate 101 in view of the configuration of the package of the image sensor device.

Accordingly, it is the intention to provide a package method of a semiconductor device, which can overcome the drawbacks of the prior art.

SUMMARY OF THE INVENTION

It is one of objectives of the present invention to provide a package of a semiconductor device with a flexible wiring substrate, which directly attaches a flexible printed circuit board unto a semiconductor substrate, so that the package size can be reduced and the cost down can be obtained.

It is another one of objectives of the present invention to provide a package of a semiconductor device with a flexible wiring substrate, which is suitable to a package of an image sensor device.

In order to achieve the above objectives of this invention, the present invention provides a package of a semiconductor device with a flexible wiring substrate and a method thereof. The package of the semiconductor device of the present invention includes a semiconductor substrate with at least one pad on a surface thereof, a bump bonded to the pad, an adhesive layer on the bump, and a flexible wiring substrate having at least one contact section being electrically connected with the bump by the adhesive layer.

The present invention makes the flexible wiring substrate directly electrically connected with the semiconductor device. The shrinkage of the package of the semiconductor device becomes realizable. Moreover, the package method of the present invention is simple and easily completed.

BRIEF DESCRIPTION OF THE DRAWINGS

The objectives and features of the present invention as well as advantages thereof will become apparent from the following detailed description, considered in conjunction with the accompanying drawings.

DESCRIPTION OF THE EMBODIMENTS

The present invention provides a package of a semiconductor device electrically connected with a flexible wiring substrate and a method thereof. The package method of a semiconductor device provided by the present invention is suitable to an application for a wafer covered with a transparent plate.

Figure 1:
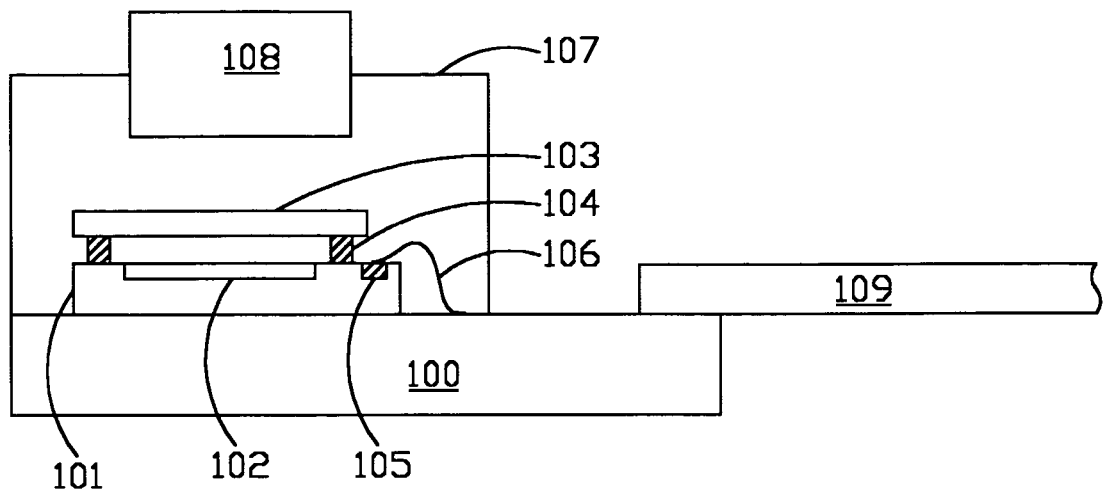
FIG. 1 is a schematic configuration of a known package of an image sensor device incorporated with a handset.
Figure 2:
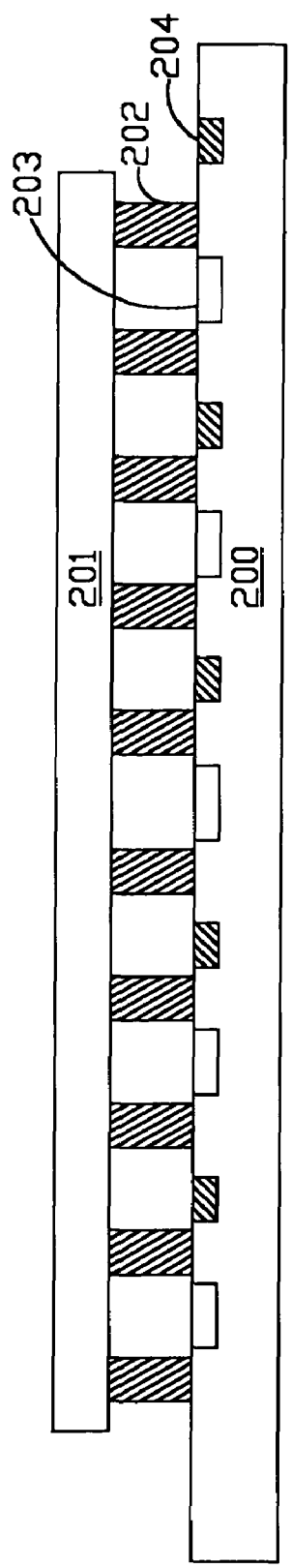
FIG. 2 through FIG. 6 are various schematic cross-sectional views respectively corresponding to one stage of a package method of the present invention according to an embodiment.
Figure 3:
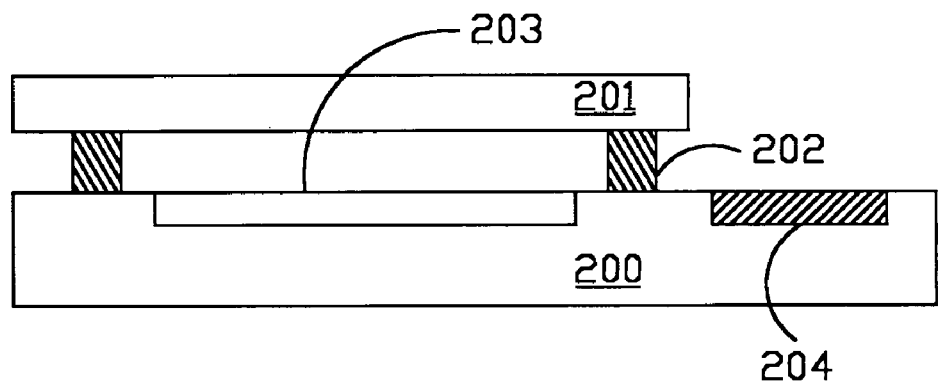
Figure 4:
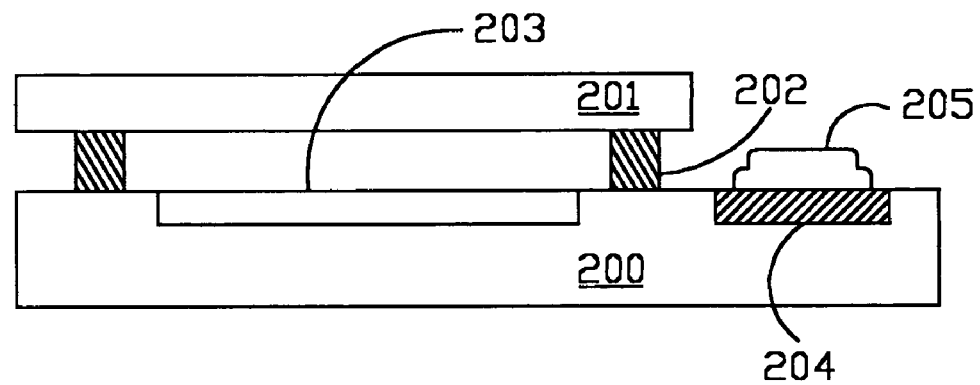

The package of a semiconductor device provided by the present invention and the method thereof will be described in detail in accordance with an embodiment of the present invention accompanying the drawings. FIG. 7 is a process flow of the package method of the present invention in accordance with the embodiment, and FIG. 2 through FIG. 6 is various schematic cross-sectional views, respectively corresponding to each step of the process flow of FIG. 7. Referring to FIG. 7, in step 70, a transparent plate 201 is covered on a surface of a wafer 200 having a plurality of image sensor device 203 and a plurality of pad 204 formed thereon, as shown in FIG. 2. The pad 204 can be an aluminum pad or a copper pad. The image sensor device 203 can be a kind of light-receiving element, such as CMOS sensor, LCOS and the like, and the transparent plate 201 can be a lens or a glass plate. The transparent plate 201 is held on the wafer 200 by adhesive material 202 and used for protecting the image sensor devices 203 from being damaged by particles adhered thereto. The wafer 200 covered with the transparent plate 201 is subjected to a dicing process and divided into chips, also known as "dies". The dicing process may be accomplished by several means, including a chemical method using acetic acid or fluoroacetic acid, and a scribing method using a diamond cutter. As a consequence, a die 200 having at least one pad 204 on a surface thereof is provided, as shown in FIG. 3. The die 200 will be called "semiconductor substrate" hereinafter. Then, in step 72, a bump is formed on the pad 204 of the semiconductor substrate 200. The bump can be a gold stud bump 205 being formed by a process as the following: a torch rod is placed close a tip of an gold wire, between which a high voltage is applied to generate a spark discharge there between, thereby providing a ball at the tip of the gold wire by heat. The ball is then pressed on the pad 204 of the semiconductor substrate 200 by using a bonding tool (capillary), the gold wire being pulled up thereby to provide the gold stud bump 205 on the pad 204, as shown in FIG. 4.

Figure 5:
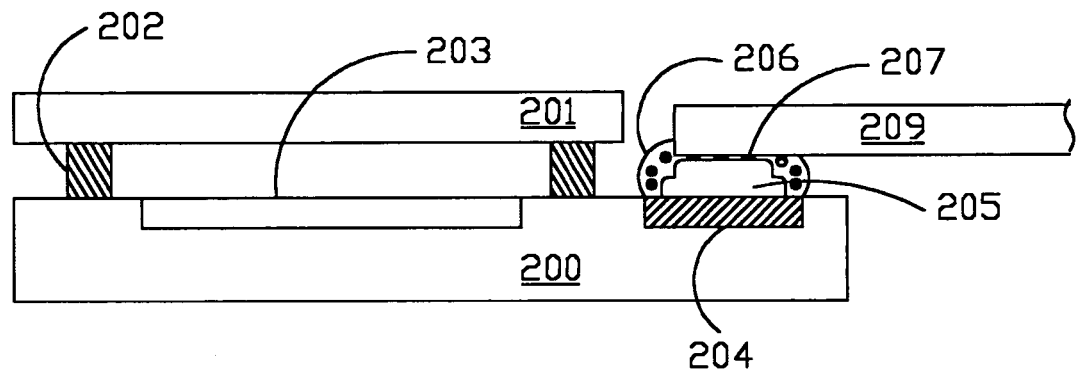

Following, in step 74, an anisotropic conductive paste 206 is applied on the gold stud bump 205 as an adhesive layer, as shown in FIG. 5. The anisotropic conductive paste 206 can be an epoxy-based adhesive resin paste with conductive fillers 207, such as metallic particles, therein. Then, in step 76, a flexible wiring substrate 209, for example, a flexible printed circuit board, having at least one contact section, is provided. The contact section of the flexible wiring substrate 209 is attached unto the anisotropic conductive paste 206 on the gold stud bump 205 to compress the anisotropic conductive paste 206 trapped in the interface between the gold stud bump 205 and the contact section of the flexible wiring substrate 209. When the anisotropic conductive paste 206 is compressed, the conductive fillers 207 inside the interface will align them and create a conductive path between the semiconductor substrate 200 and the flexible wiring substrate 209. In other words, electrical interconnection between the gold stud bump 205 and the contact section of the flexible wiring substrate 209 is made by conductive fillers' 207 mechanical contact there between.

Figure 6:
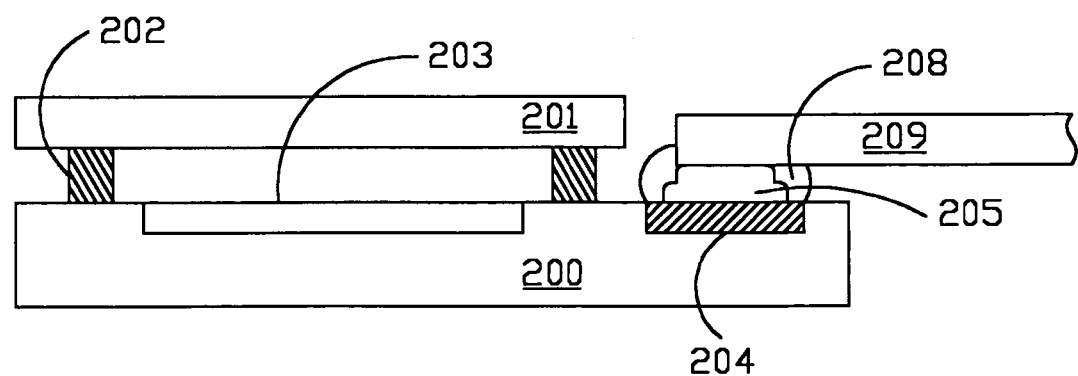
Figure 7:
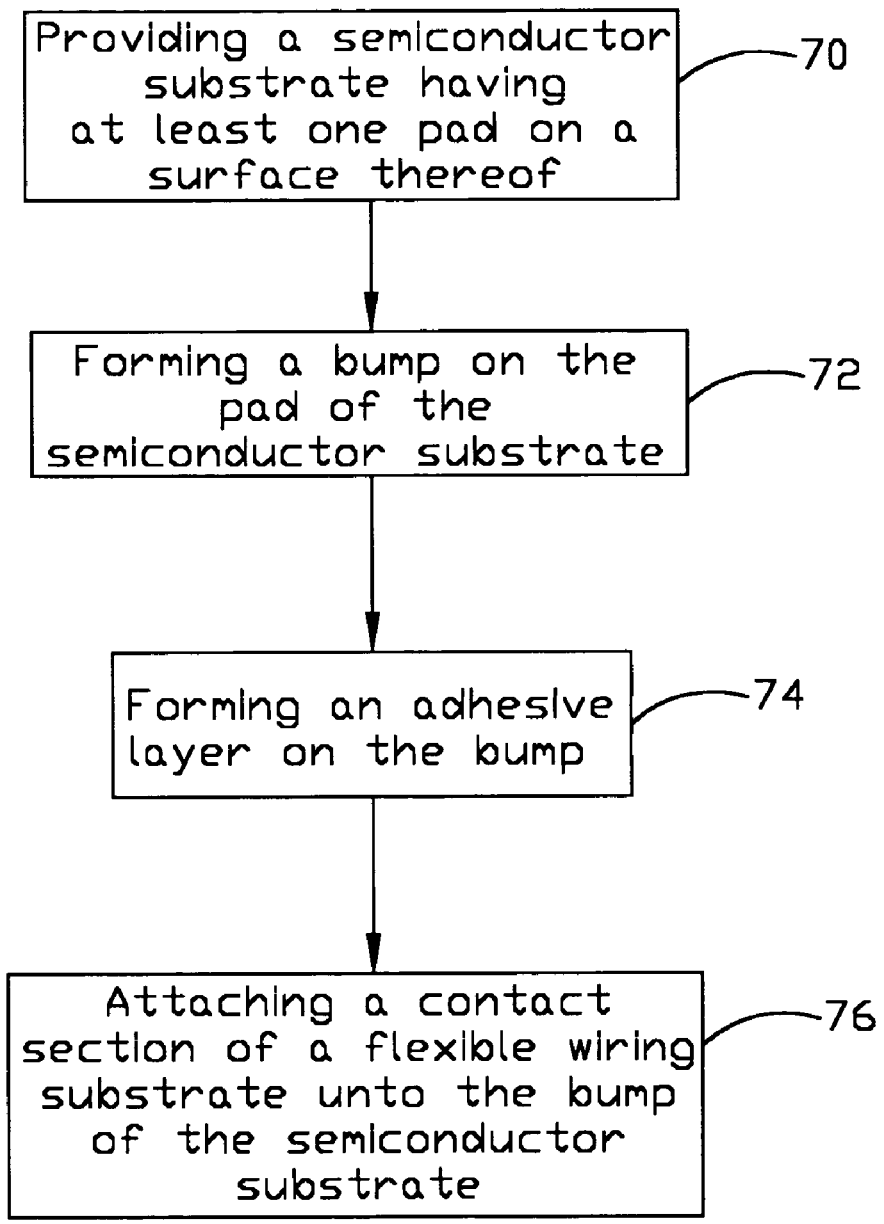
FIG. 7 is a process flow of the package method of the present invention corresponding to FIG. 2 through FIG. 6.

Alternately, as shown in FIG. 6, a non-conductive paste 208 can be applied on the gold stud bump 205 instead of the anisotropic conductive paste 206. The non-conductive paste 208 can be an epoxy adhesive resin. Then, the contact section of the flexible wiring substrate 200 is attached unto the non-conductive paste 208 on the gold stud bump 205 to compress the non-conductive paste 208 trapped in the interface between the gold stud bump 205 and the contact section of the flexible wiring substrate 209. Then, the non-conductive paste 206 trapped in the interface is squeezed out from the interface, and around the gold stud bump 205 and the contact section of the flexible wiring substrate 209. As a result, the contact section of the flexible wiring substrate 209 directly contacts with the gold stud bump 205, and both of them are attached together by the non-conductive paste 208 around them.

Figure 8:
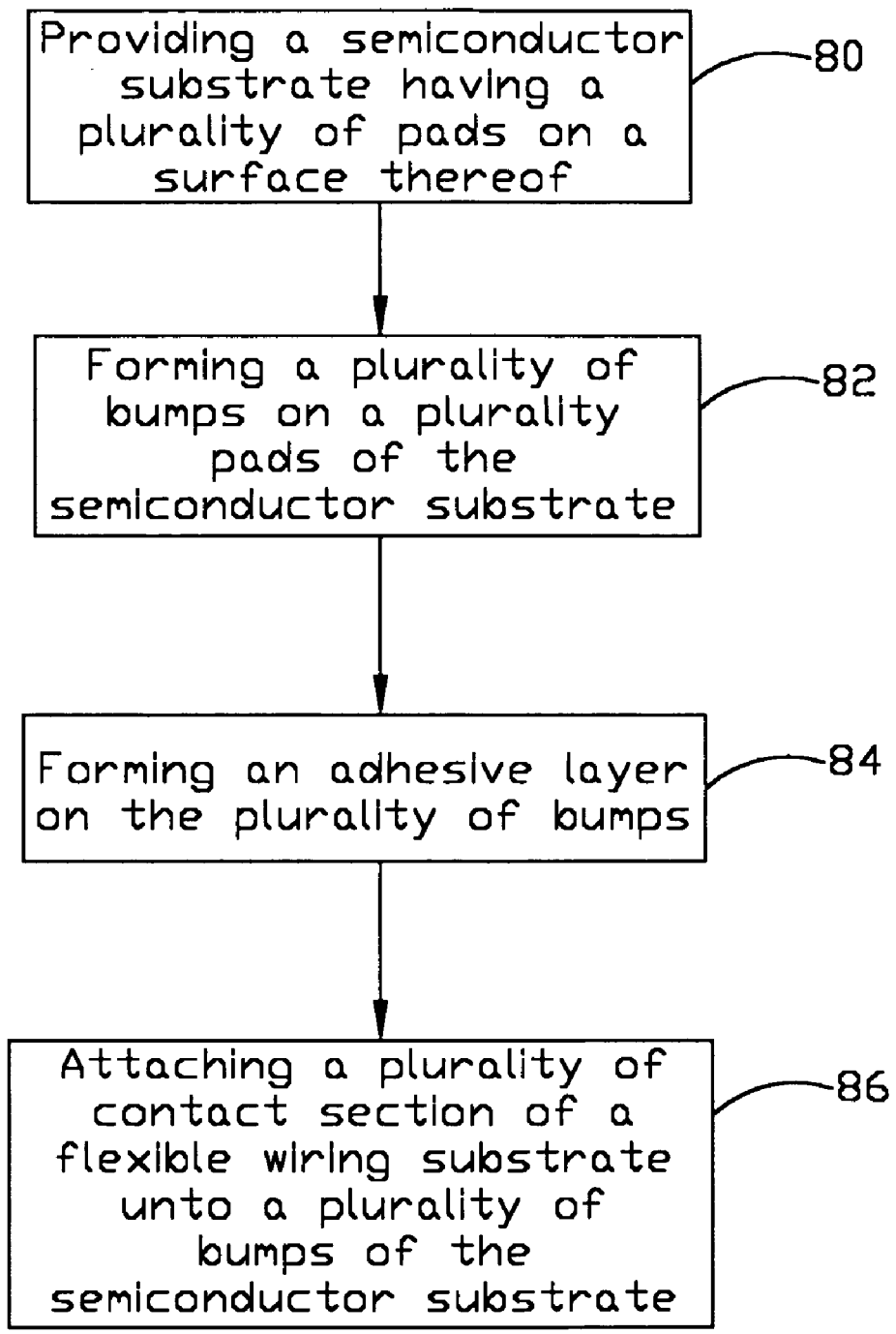
FIG. 8 is an another process flow chart of the package method of the present invention corresponding to FIG. 9 through FIG. 12.
Figure 9:
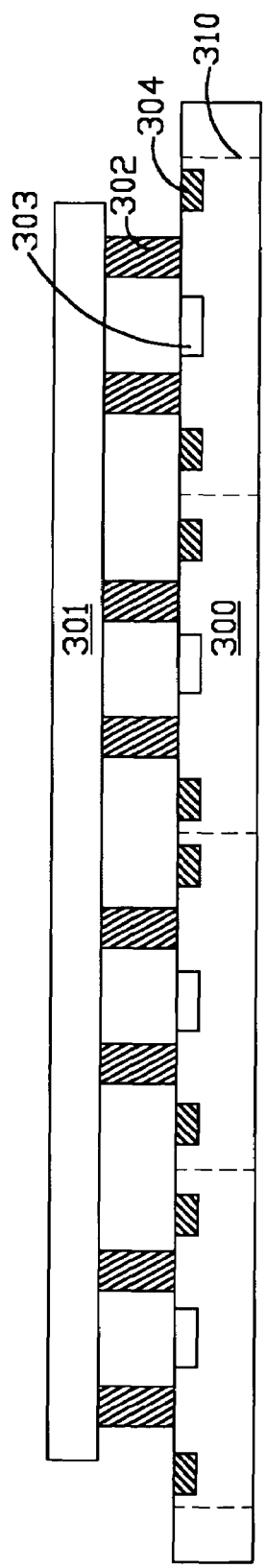
FIG. 9 through FIG. 12 are various schematic cross-sectional views respectively corresponding to one stage of a package method of the present invention according to other embodiment.
Figure 10:
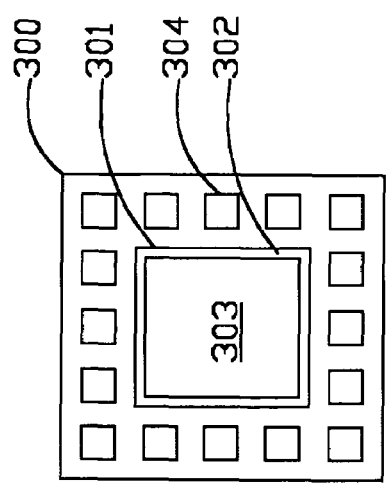

FIG. 8 is a process flow chart of the package method of the present invention in accordance with the embodiment. Referring to FIG. 8, in step 80, a structure is provided, as shown in FIG. 9. To implement a dicing process along the cut-line 310 divided into dies, as shown in FIG. 10. A plurality of pads 304 arranged to average, surround the image sensor device 303. To match up this kind of structure, a dicing process must to make a plurality of pads 304 are displayed and can connect to the external circuit. The dicing process may be accomplished by several well-known means, including a chemical method using acetic acid or fluoroacetic acid, and a scribing method using a diamond cutter.

Following, in step 82, a plurality of bumps are formed on a plurality of the pads 304 of the semiconductor substrate 300. The bumps can be a plurality of gold stud bumps 305 that are formed by a process as the following: a torch rod is placed close a tip of an gold wire, between which a high voltage is applied to generate a spark discharge there between, thereby providing a ball at the tip of gold wire by heat. The ball is then pressed on a plurality of the pads 304 of the semiconductor substrate 300 by using a bonding tool (capillary), the gold wire being pulled up thereby to provide a plurality of the gold stud bumps 305 on a plurality of the pads 304.

In step 84, an an-isotropic conductive paste 306 is applied on a plurality of the gold stud bumps 305 as an adhesive layer. The an-isotropic conductive paste 306 can be an epoxy-based adhesive resin paste with conductive fillers 307, such as metallic particles, therein. The an-isotropic conductive paste 306 formed method as well as the above embodiment and need not be described herein.

Figure 11:
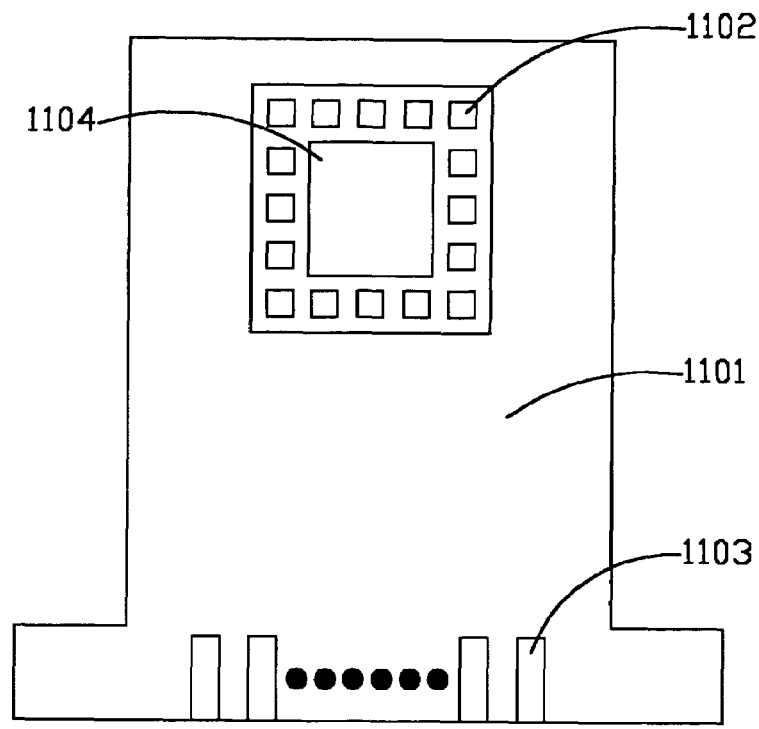
Figure 12:
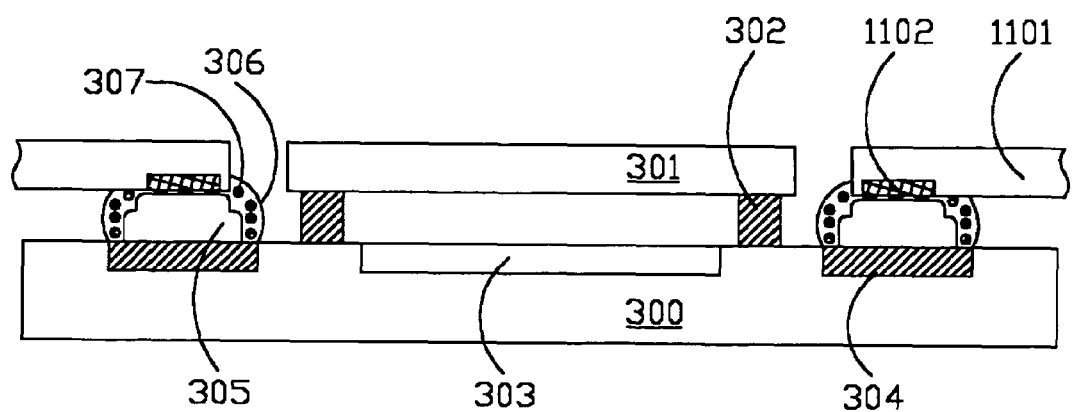

In step 86, the flexible wiring substrate 1101 having a plurality of the contact sections 1102 and that are corresponding a plurality of the pads 304 as shown in FIG. 11. The flexible wiring substrate 1101 having a hollow region 1104 and a plurality of the contact sections 1102 surrounded the hollow region 1104. The hollow region 1104 main function is to make the flexible wiring substrate 1101 directly electrically connected with the die having the image sensor device 303 by an adhesive layer 306, therefore the whole process can be a module. The contact sections 1102 of the flexible wiring board 1101 are attached unto the an-isotropic conductive paste 306 on a plurality of the gold stud bumps 305 to compress the an-isotropic conductive paste 306 trapped in the interface between a plurality of the gold stud bumps 305 and the contact sections 1102 of the flexible wiring substrate 1101. When an-isotropic conductive paste 306 is compressed, conductive fillers 307 inside the interface will align themselves and create a conductive path between the semiconductor substrate 300 and flexible wiring substrate 1101, as shown in FIG. 12. In other words, electrical interconnection between a plurality of the gold stud bumps 305 and a plurality of the contact sections 1102 of the flexible wiring substrate 1101 is made by conductive filler's 307 mechanical contact there between. The signal of the image sensor device 303 can be directly transmission to the external contact sections 1103 of the flexible wiring substrate 1101 by the an-isotropic conductive paste 306 of a plurality of the gold stud bumps 305, a plurality of the contact sections 1102 of the flexible wiring substrate 1101. The contact sections 1102 and the external contact sections 1103 are interconnect with the conducting wire.

With the progress of the technology, image sensor device is incorporated with a portable product, such as mobile phone. Therefore, to demand the least volume of the image sensor device and to demand the best dots per inch has led to increasing demand in practice. To reach this objective, another embodiment of present invention provides the structure of Invert CMOS image sensor. The Invert CMOS image sensor which the incident light is from the backside of chip avoided the interference and absorption through ILD, metal and IMD layers. It can improve the sensitivity and increase the fill ratio of sensor area in whole chip. Furthermore, the Invert CMOS image sensor interconnection section configured on the backside of the chip and made the interconnection section directly electrically connected with a flexible wiring substrate and further satisfied the demand of configuration. Following, detail described this embodiment of the present invention.

Figure 13A:
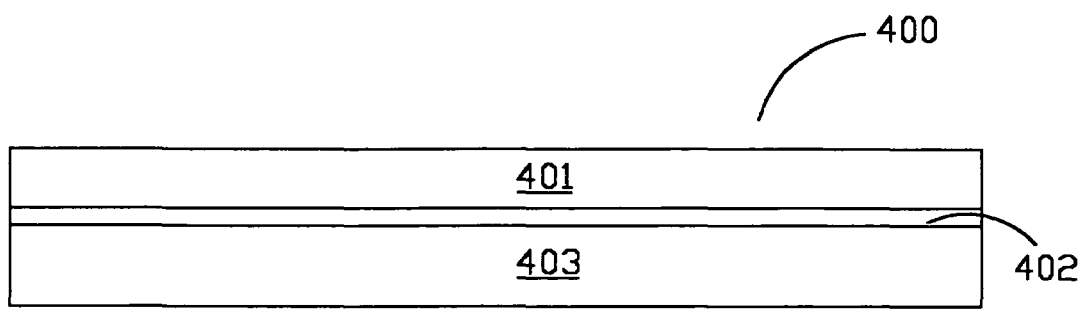
FIG. 13A through FIG. 13N are various schematic cross-sectional views respectively corresponding to one stage of a package method of the present invention according to another embodiment.

Referring to FIG. 13A, providing a semiconductor structure 400 firstly, the structure of semiconductor structure 400 such as the silicon on insulator (SOI) structure that having three semiconductor substrates: upper silicon substrate 401, below silicon substrate 403 and buried oxide layer 402. The thickness of upper silicon substrate 401 is such as 5 um. The material of buried oxide layer 402 is such as silica. The silicon on insulator (SOI) structure is of electric isolation technology which can avoid the latch-up and having low electric leakage property by utilizing the buried oxide layer 402. A method of forming the silicon on insulator (SOI) structure such as Separation by Implanted Oxygen or Wafer Bonding.

Figure 13B:
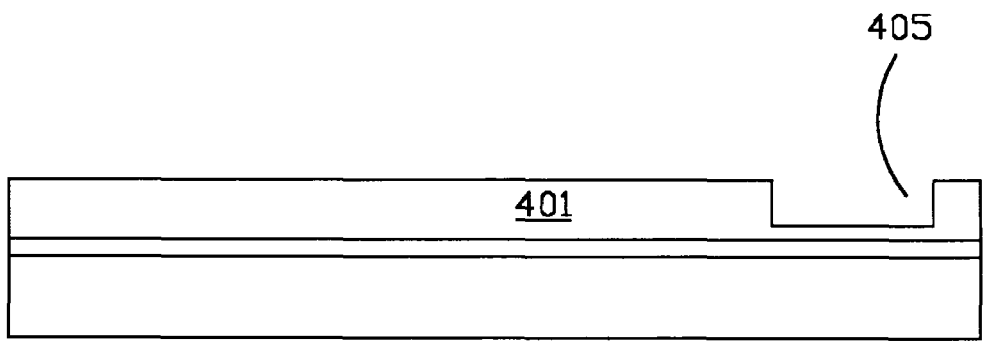
Figure 13C:
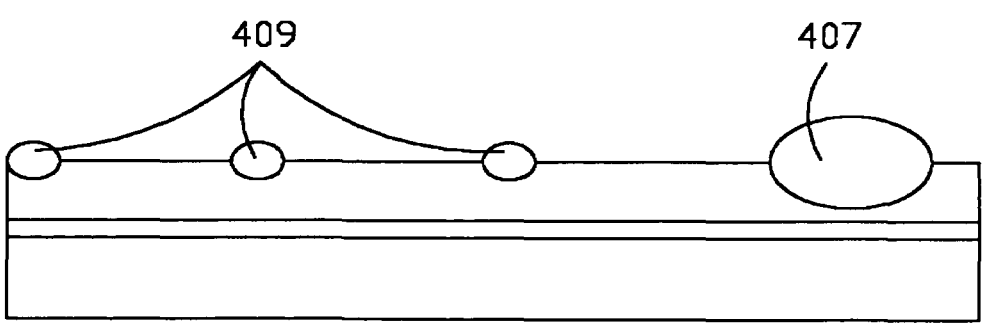

Subsequently, a photoresist layer (not illustrated) is deposited on the upper silicon substrate 401, which forms a concave gap 405 on one side of the upper silicon substrate 401. The depth of the concave gap 405 is such as 2 um, as shown in FIG. 13B. The concave gap 405 is used to form an interconnection section of the image sensor device. Then, a hard mask layer is deposited on the upper silicon substrate 401 which material such as $Si_3N_4$. The hard mask layer is used to be the hard mask and etch stop layer when forming the field oxide layer. Performing an etching process on the hard mask layer, which forms a plurality of the fillisters and to deepen the concave gap 405. The depth of concave gap 405 can be deeper after deepened. Methods of the etching process such as dry etching process. Then, forming the first dielectric layer 407 and a plurality of the second dielectric layers 409, which on a plurality of the fillisters of the upper substrate surface 401 and concave gap 405, as shown in FIG. 13C. A method of the dielectric layer is such as the hot oxide process and material such as silica thereof. The first dielectric layer 407 and a plurality of the second dielectric layers provide the isolation among the follow-up semiconductor process.

Forming the first dielectric layer 407 on the concave gap 405 which can make the concave gap 405 more deepened. Consequently, the thickness of the upper substrate 401 becomes thinner and a section is corresponded the concave gap 405, thereof. And the main objective to deepen the concave gap 405 is provided, when the semiconductor process reversed, forms a backside of the semiconductor, thus making it easy to remove the buried oxide layer 402 and upper substrate 401, and section is corresponding the concave gap 405, thereof. Next, forming an interconnection section of image sensor device, which can directly electrically connected with a flexible wiring substrate.

Figure 13D:
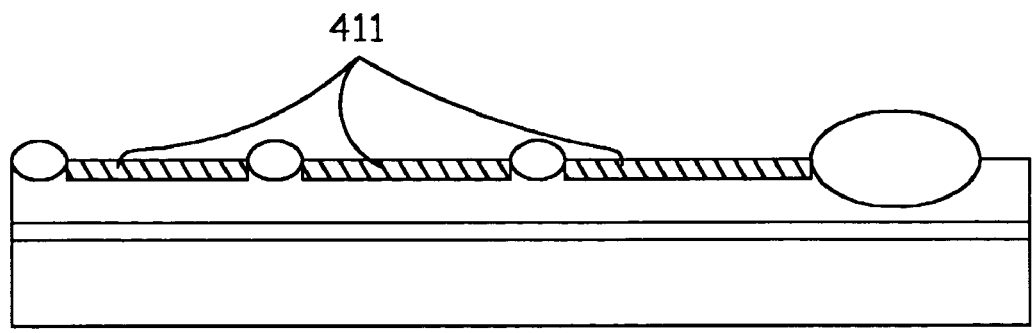

Subsequently, forming a plurality of the photo diodes 411 between the first dielectric layer 407 and a plurality of the second dielectric layers 409, as shown in FIG. 13D. The structure of a plurality of the photo diodes 411 such as photo-conductivity cell or junction diode.

Figure 13E:
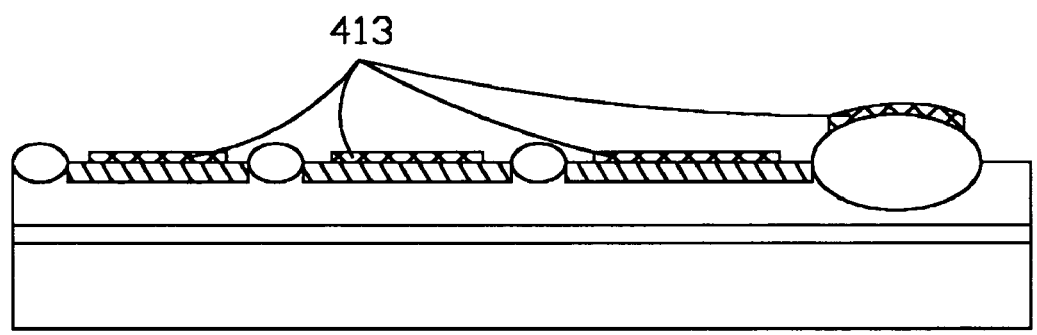

Then, a conductor layer (not illustrate) is deposited on the upper silicon substrate 401, and the material of the conductor layer such as poly silicon, and a method of forming the conductor layer such as chemical vapor deposition. Next, a photoresist layer (not illustrate) is deposited on said conductor layer, and patterning photoresist layer, followed by an etching process, therefore forming a plurality of the conductor layers contact 413 between a plurality of the photo diodes 411 and the first dielectric layer 407, as shown in FIG. 13E.

Figure 13F:
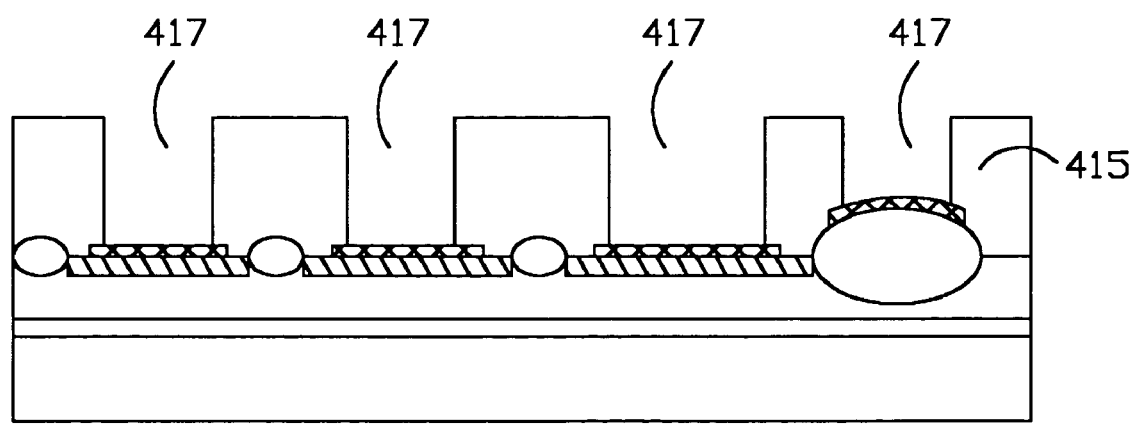

Subsequently, referring to FIG. 13F, pre-metal dielectric layers 415 is deposited on the upper silicon substrate 401, and a deposit method such as chemical vapor deposition that material such as silica. A pre-metal dielectric layer 415 is provided as isolation layer between the gate conducting wire and metal wire, before metal process. Next, utilizing the dry etching patterning the pre-metal dielectric 415, forming a plurality of the gaps 417, which section corresponding upper a plurality of the conductor layer contacts 413, and exposed the surface of a plurality of the conductor layer contacts 413.

Figure 13G:
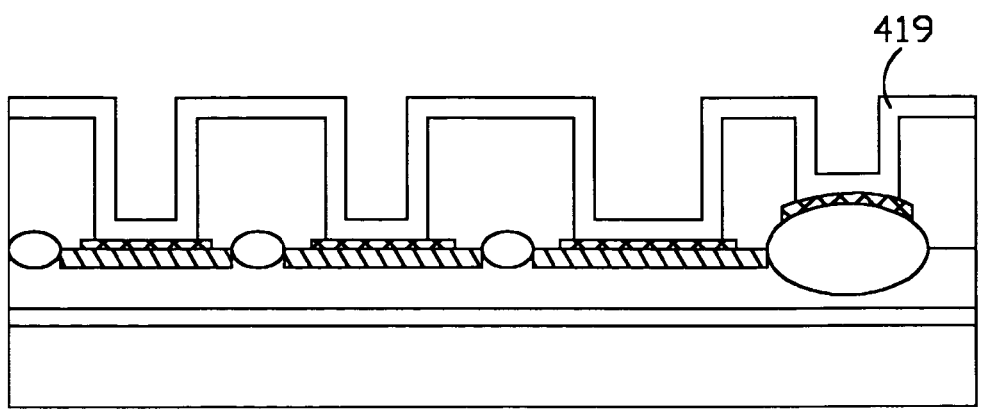

Then, prepare the forming of a plurality of the inter-metal dielectric layers in a plurality of the gaps 417. At the first, an adhesive layer 419 is deposited between the pre-metal dielectric layer 415 and a plurality of the gaps 417 which deposit method such as reactive sputtering deposition and that material such as titanium or titanium nitride, as shown in FIG. 13G.

Figure 13H:
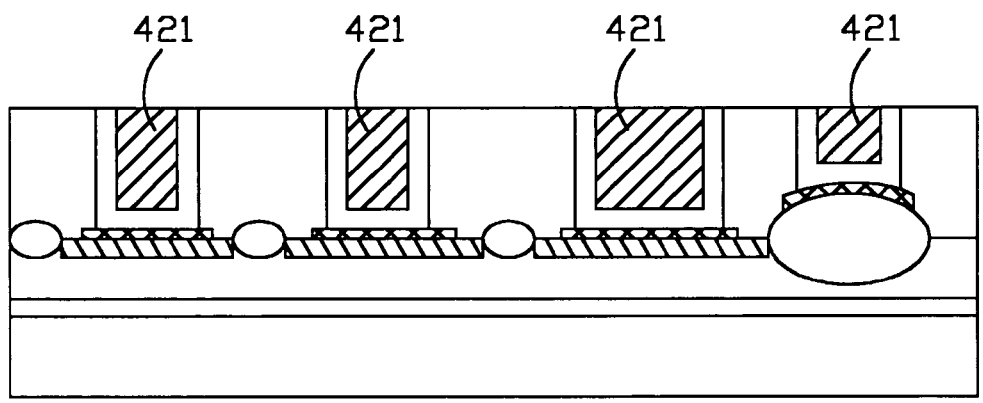

And then, a blanket of tungsten (not illustrated) is deposited on the adhesive layer 419, which deposit method such as chemical vapor deposition. Next, utilizing the dry etching and chemical mechanical polish remove the tungsten and adhesive 419 in the gaps 417 so as to form a plurality of the inter-metal dielectric layers 421, as shown in FIG. 13H.

Figure 13I:
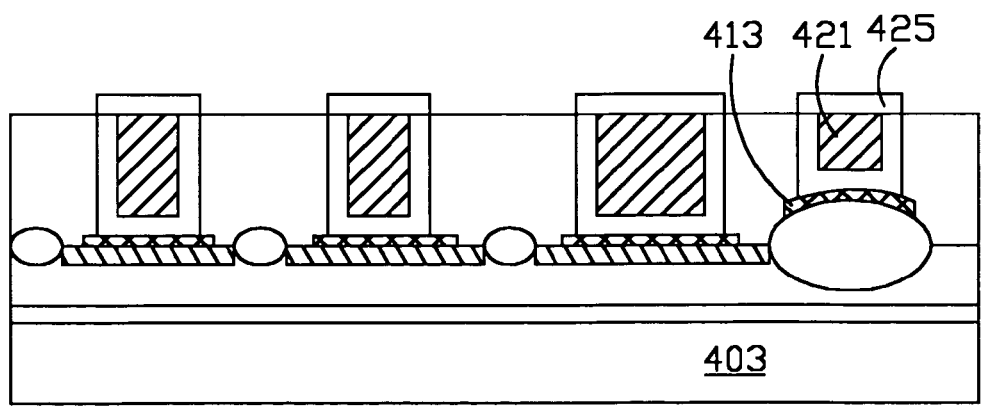

Following, as shown in FIG. 13I, a metal layer is formed (not illustrated) on the pre-metal dielectric layer 415 and a plurality of the inter-metal dielectric layers 421. Alternatively, for adhesion of the metal layer, a metal barrier layer (not shown), such as a layer of titanium nitride or titanium, is formed prior to the formation of the metal layer. The multitudes of metal contacts 425 are formed by lithography and etching steps, as shown in FIG. 13I. The positions of the metal contacts 425 are corresponding to the inter-metal dielectric layers 421 and inter connect to the conductor layer contacts 413 through the inter-metal dielectric layers 421.

Figure 13J:
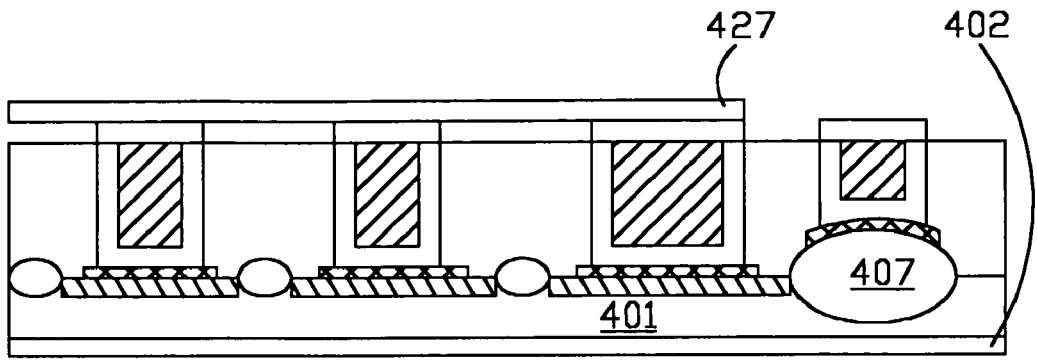

Then, removing the below silicon substrate 403, utilize the polish or other method. At this time, the below silicon substrate 403 is removed that makes the semiconductor structure 400 become thinner. Therefore, a glass slice 427 is covered on a plurality of the metal contacts 425 and supports the whole of semiconductor structure 400, as shown in FIG. 13J. Removing below silicon substrate 403 make the whole structure become thinner, and it can help form the inverter image sensor device which the incident light is from the backside of the chip can improve the sensitivity and increase the fill ratio.

Following, the whole process of the semiconductor structure 400 will begin from the backside, in other words that will begin from the buried oxide layer 402.

Figure 13K:
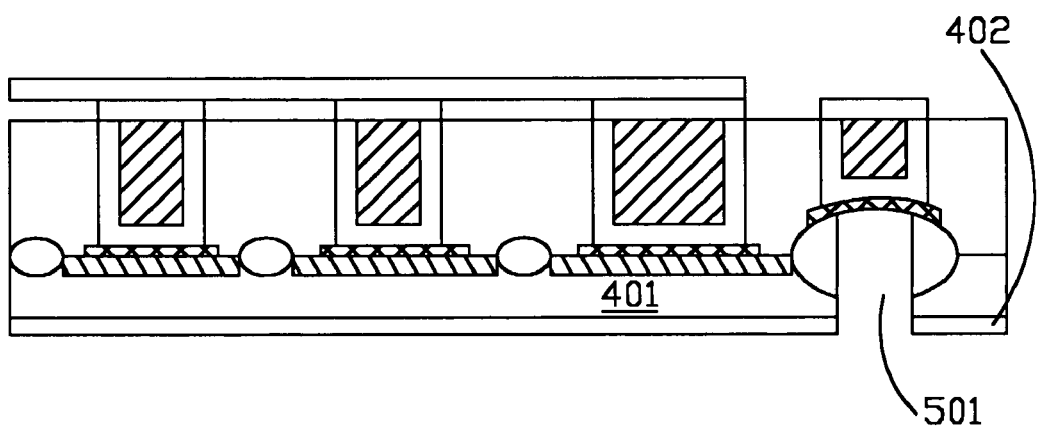

Next, utilizing the etching process removes partial of the first dielectric layer 407 in the concave gap 405, partial upper silicon substrate 401 and partial buried oxide layer 402 as so to form a new downward gap 501, as shown in FIG. 13K. A method of the etching processes such as dry etching. The new downward gap 501 which will form an interconnect section so as to directly electrically connected with a flexible wiring substrate.

Figure 13L:
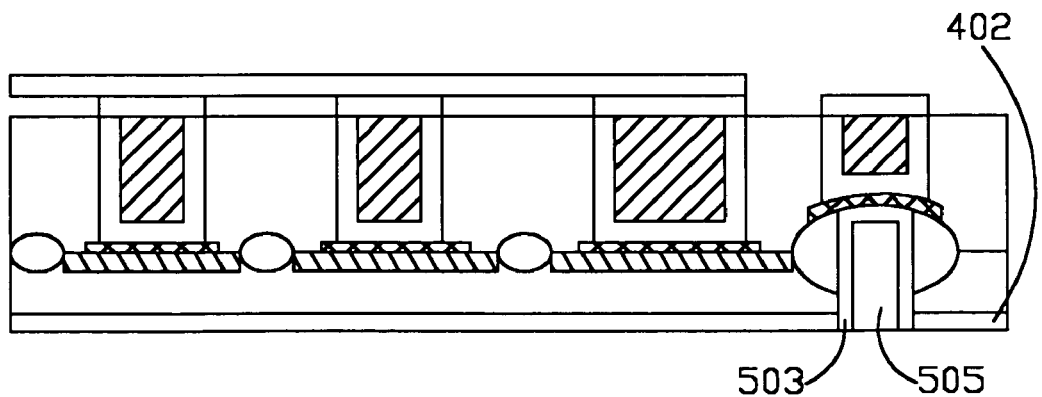
Figure 13M:
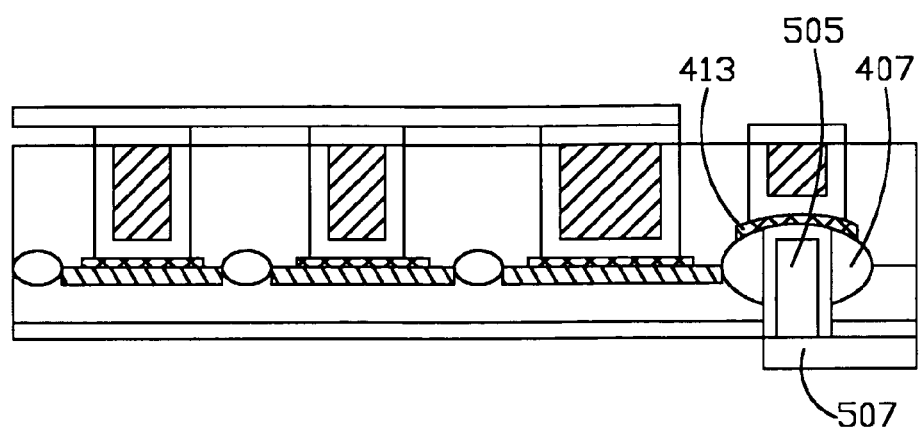
Figure 13N:
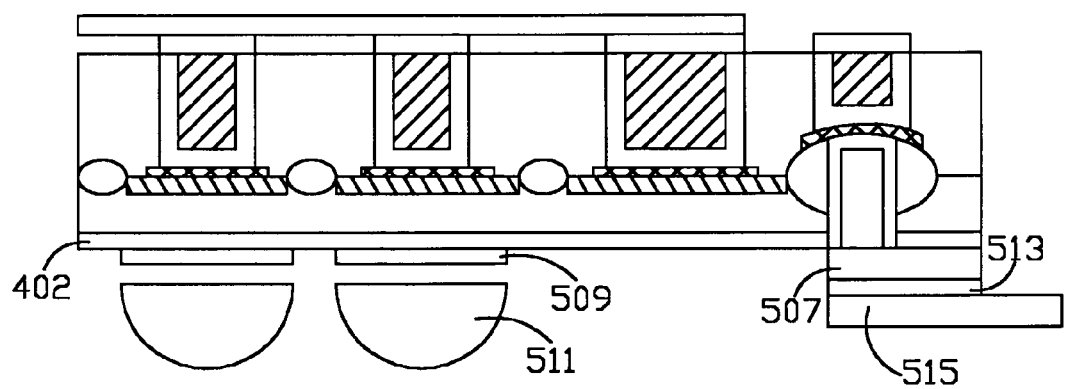

Following, an adhesive layer 503 is deposited on buried oxide layer 402 and new downward gap 501, and a method of the deposit such as reactive sputtering deposition and that material such as titanium or titanium nitride. Then, a blanket of tungsten (not illustrated) is deposited on adhesive layer 503, which method such as chemical vapor deposition. Next, using dry etching to remove partial tungsten on the buried oxide layer 402 and adhesive layer 503; to retain tungsten and adhesive layer 503 in the new downward gap 501 so as to form a new metal inner layer 505, as shown in FIG. 13L. Then, forming a new metal pad 507 on said new metal interconnection layer 505, as shown in FIG. 13N. The new metal pad 507 can interconnect a plurality of the conductor layers 413 by said new metal inner layer 505, and make the new metal pad 507 can directly electrically connected with a flexible wiring substrate.

Referring to FIG. 13N, forming a plurality of the color filters 509 and a plurality of the micro-lenses 511 on the buried oxide layer 402, which forms a inverter COMS image sensor device 500 that having a interconnection section. Further, a plurality of the color filters 509 and a plurality of the micro-lenses 511 formed on the buried oxide layer 402, which can shorten the incident light distance from micro-lenses 511 to photo diode, improve the sensitivity avoid the interference and absorption through ILD, metal and IMD layers, moreover increasing the fill ratio of the sensor area in whole chip. An an-isotropic conductive paste 513 is applied on the new metal pad 507 as an adhesive layer. The an-isotropic conductive paste 513 can be an epoxy-based adhesive resin paste with conductive fillers. Next, a flexible wiring substrate 515, for example, a flexible printed circuit board, having at least one contact section is provided. The electrical interconnection between the contact section of the flexible wiring substrate 515 and the new metal pad 507 is made by an-isotropic conductive paste 513. In other words, the flexible wiring substrate 515 could directly electrically connected with the new metal pad 507. To use interconnection section of the image sensor device established on the backside make the interconnection section of the image sensor device directly electrically connected with flexible wiring substrate and satisfy the configuration needs.

The present invention makes the flexible wiring substrate directly electrically connected with the semiconductor device. The shrinkage of the package of the semiconductor device becomes realizable. The package method of the present invention is simple and easily completed. It is possible to attain a purpose of cost down by the present invention.

The embodiments are only used to illustrate the present invention, not intended to limit the scope thereof. Many modifications of the embodiments can be made without departing from the spirit of the present invention.

What is claimed is:

1. A package of a semiconductor device with a flexible wiring substrate, comprising:
   a semiconductor substrate with a plurality of pads on a surface thereof;
   a plurality of bumps bonded to said pads;
   an adhesive layer on said bumps; and
   said flexible wiring substrate having a plurality of contact sections being electrically connected with said bumps by said adhesive layer and having a hollow section, wherein said a plurality of contact sections are corresponding to said a plurality of pads, and said a plurality of contact sections surrounds said hollow section, and said semiconductor substrate and said flexible wiring substrate at opposite sides of said adhesive layer.

2. The package of claim 1, wherein said semiconductor substrate has at least one image sensor on said surface of said substrate, which is surrounded by said a plurality of pads and is corresponding to said hollow section.

3. The package of claim 2, wherein said image sensor comprises a photo diode.

4. The package of claim 1, wherein said bumps are stud bumps.

5. The package of claim 4, wherein said bumps are gold stud bumps.

6. The package of claim 1, wherein said adhesive layer comprises non-conductive paste or an isotropic conductive paste.

7. A package of a semiconductor device with a flexible wiring substrate, comprising:
   a semiconductor substrate with a plurality of pads surrounding on a surface thereof;
   a transparent plate held on said surface of said semiconductor substrate by a adhesive material to cover said surface, wherein both of said flexible wiring substrate and said transparent plate are on said surface of said semiconductor substrate;
   a plurality of bumps bonded to said pads;
   an adhesive layer on said bumps; and
   said flexible wiring substrate having a plurality of contact sections being electrically connected with said bumps by said adhesive layer and having a hollow section, wherein said a plurality of contact sections are corresponding to said a plurality of pads, and said a plurality of contact sections surrounds said hollow section.

8. The package of claim 7, wherein said semiconductor substrate has at least one image sensor on said surface of said substrate, which is surrounded by said a plurality of pads and is corresponding to said hollow section.

9. The package of claim 8, wherein said image sensor comprises a photo diode.

10. The package of claim 7, wherein said bumps are stud bumps.

11. The package of claim 10, wherein said bumps are gold stud bumps.

12. The package of claim 7, wherein said adhesive layer comprises non-conductive paste or an isotropic conductive paste.

* * * * *